(12) United States Patent
Escoffier (10) Patent No.: US 10,692,997 B2
(45) Date of Patent: Jun. 23, 2020

(54) BIDIRECTIONAL TRANSISTOR HAVING A LOW RESISTANCE HETEROJUNCTION IN AN ON STATE

(71) Applicant: Commissariat A L'Energie Atomique et aux Energies Alternatives, Paris (FR)

(72) Inventor: Rene Escoffier, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/567,088

(22) Filed: Sep. 11, 2019

(65) Prior Publication Data
US 2020/0098908 A1    Mar. 26, 2020

(30) Foreign Application Priority Data
Sep. 11, 2018  (FR) ...................................... 18 71019

(51) Int. Cl.
*H01L 29/778*    (2006.01)
*H01L 29/205*    (2006.01)
(Continued)

(52) U.S. Cl.
CPC ...... *H01L 29/7786* (2013.01); *H01L 29/2003* (2013.01); *H01L 29/205* (2013.01);
(Continued)

(58) Field of Classification Search
None
See application file for complete search history.

(56) References Cited

U.S. PATENT DOCUMENTS 7,465,997 B2 * 12/2008 Kinzer ................ H01L 27/0605
257/192
9,059,239 B2 *  6/2015 Escoffier ............. H01L 29/1029
(Continued)

FOREIGN PATENT DOCUMENTS

JP    2015-122544 A    7/2015

OTHER PUBLICATIONS

French Preliminary Search Report dated May 22, 2019 in French Application 18 71019, filed on Sep. 11, 2018 (with English Translation of Categories of Cited Documents & Written Opinion).

*Primary Examiner* — Jeffery S Zweizig
(74) *Attorney, Agent, or Firm* — Oblon, McClelland, Maier & Neustadt, L.L.P.

(57) ABSTRACT

A bidirectional heterojunction transistor includes first and second conduction electrodes, first and second gates between the conduction electrodes, and first and second reference electrodes between the gates. The transistor further includes a superposition of semiconductor layers, including channel zones that are vertically in line with the gates, a first conduction zone between the first conduction electrode and the first channel zone, and a second conduction zone between the second conduction electrode and the second channel zone. The superposition of semiconductor layers also includes a third conduction zone that is separated from the first and second conduction zones by the first and second channel zones, respectively, and a first electrical connection that is connected to the third conduction zone and to the first reference electrode.

12 Claims, 8 Drawing Sheets

(51) Int. Cl.
  *H01L 29/417*   (2006.01)
  *H01L 29/423*   (2006.01)
  *H01L 29/20*    (2006.01)
  *H01L 29/66*    (2006.01)
  *H03K 17/687*   (2006.01)
  *H01L 21/285*       (2006.01)
  *H01L 21/02*        (2006.01)

(52) U.S. Cl.
  CPC .. *H01L 29/41775* (2013.01); *H01L 29/42376* (2013.01); *H01L 29/66462* (2013.01); *H03K 17/687* (2013.01); *H01L 21/0217* (2013.01); *H01L 21/0228* (2013.01); *H01L 21/0254* (2013.01); *H01L 21/02164* (2013.01); *H01L 21/02178* (2013.01); *H01L 21/28575* (2013.01); *H03K 2017/6878* (2013.01)

(56) References Cited

U.S. PATENT DOCUMENTS

| | | | | |
|---|---|---|---|---|
| 9,184,098 B2 * | 11/2015 | Salcedo | ............ | H01L 29/7786 |
| 9,406,673 B2 * | 8/2016 | Curatola | ............ | H01L 27/0883 |
| 9,837,522 B2 * | 12/2017 | Prechtl | ................ | H01L 29/1029 |
| 2008/0143421 A1 | 6/2008 | Yanagihara et al. | | |
| 2015/0179643 A1 | 6/2015 | Curatola et al. | | |

* cited by examiner

BIDIRECTIONAL TRANSISTOR HAVING A LOW RESISTANCE HETEROJUNCTION IN AN ON STATE

The invention relates to the bidirectional power transistor circuits that are used for example for high-frequency applications, and in particular to those that require bidirectional operation based on high-electron-mobility transistors.

Operation at increasingly high frequencies is required by many electronic applications. These applications are not limited to the telecommunications market. Switches in high frequency ranges are also necessary in on-board electronics intended for cars and ground-based means of transportation, aeronautical and medical systems or in home-automation solutions, for example. These applications for the most part require high-power switches that operate in frequency ranges exceeding one megahertz.

Historically, high-frequency power switches have for a long time used field-effect transistors based on a semiconductor channel. At lower frequencies, junction transistors are preferred because they are able to withstand higher current densities. However, because of the relatively limited breakdown voltage of each of these transistors, power applications require many transistors to be connected in series. These series transistors generate substantial losses, both in the steady-state and switching regimes, which constitutes a major drawback of this type of solution.

An alternative to high-frequency power switches is the use of high-electron-mobility field-effect transistors, also denoted by the term heterostructure field-effect transistors. Such transistors include a superposition of two semiconductor layers having different bandgaps, forming a quantum well at their interface. Electrons are confined to this quantum well and form a two-dimensional electron gas. For reasons of high-voltage and temperature withstand, these transistors are chosen to have a wide energy bandgap.

Among wide energy bandgap HEMT transistors, transistors based on gallium nitride are very promising. The width of their energy bandgap results in a higher avalanche voltage, compared to conventional electronic materials, in a high carrier saturation velocity, and in good thermal and chemical stability. The breakdown field of gallium nitride may thus be higher than $3 \times 10^6$ V/cm, thereby easily allowing transistors with breakdown voltages higher than 100 V to be produced. In addition, such transistors allow very high current densities to be obtained because of the very high electron mobility in the interface gas.

Gallium nitride has a wide energy bandgap of 3.39 eV. In addition, ternary alloys such as AlGaN or InGaN may easily be produced from GaN. A HEMT transistor based on gallium nitride may also be produced on a silicon substrate. GaN HEMT transistors are therefore much less expensive to produce than transistors based on SiC for example. Although SiC-based transistors also have a wide energy bandgap, ternary alloys can be difficult to produce from this material, and it cannot be produced on a standard silicon substrate, thereby making its fabrication cost prohibitive and greatly limiting its applications.

The patent EP2736078 describes a high-electron-mobility bidirectional transistor based on the use of a stack of a GaN layer and of an AlGaN layer. The transistor includes conduction electrodes, between which a control gate is positioned. An electron channel runs between the conduction electrodes. The gate is biased relative to a reference contact that is located in the middle of the electron channel. To withstand high voltages and hence to increase the breakdown voltage of the transistor, it is necessary to observe a minimum distance of 10 µm between the gate and each of the conduction electrodes for bidirectional operation. Such a bidirectional transistor therefore has the drawback of increasing the footprint of the component and its resistance in the on state in comparison with a unidirectional transistor.

The invention aims to overcome one or more of these drawbacks. The invention thus relates to a device including a bidirectional heterojunction field-effect transistor, such as defined in the appended Claim 1.

The invention also relates to the variants of the dependent claims. A person skilled in the art will understand that each of the features of the variants presented in the description or in the dependent claims may be combined independently with the features of an independent claim without constituting an intermediate generalization.

Other features and advantages of the invention will become clearly apparent from the description of it that is given below, by way of nonlimiting indication, with reference to the appended drawings, in which.

Figure 1:
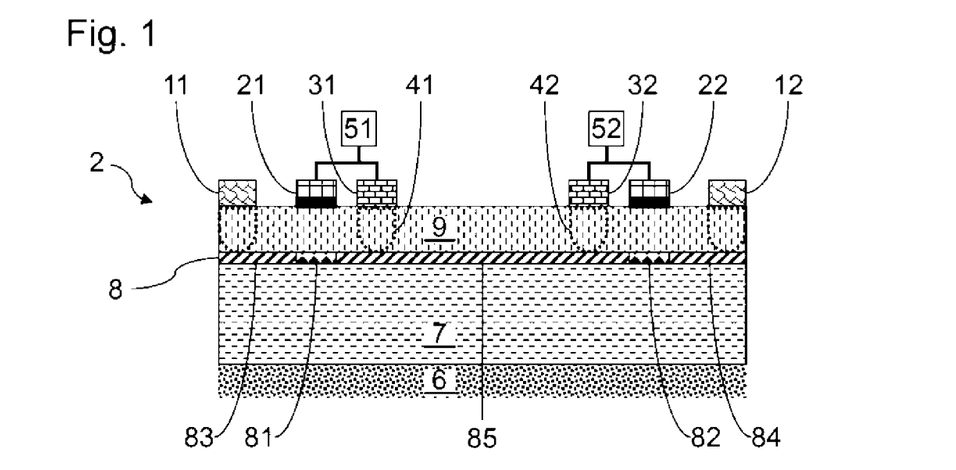
FIG. 1 is a cross-sectional view of an HEMT transistor according to one embodiment of the invention.
Figure 2:
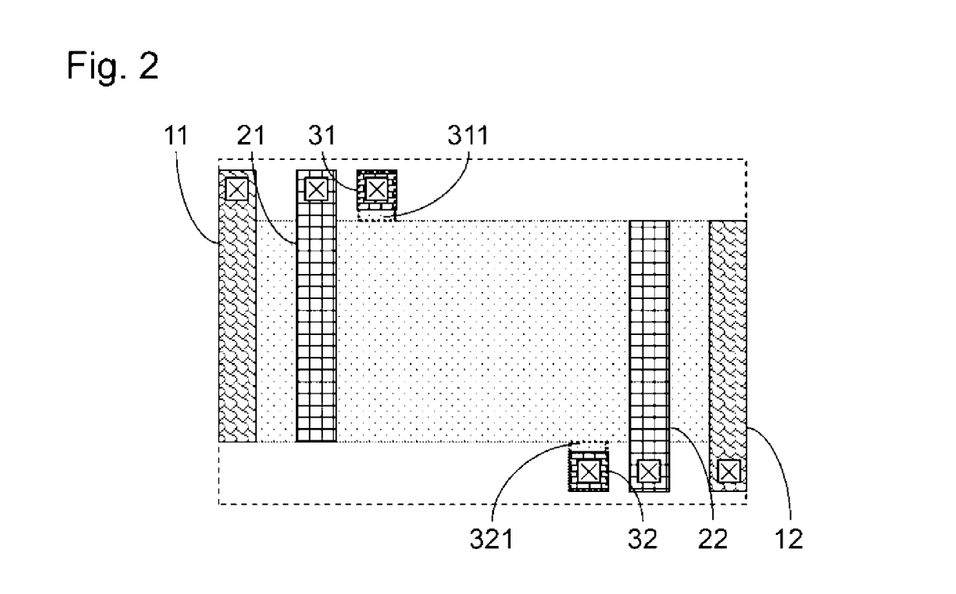
FIG. 2 is a top view of the transistor of FIG. 1.

FIG. 1 is a schematic figure showing an exemplary HEMT transistor 2, i.e. a high-electron-mobility field-effect transistor, according to one embodiment of the invention. FIG. 2 is a top view of this transistor 2. The transistor 2 includes a silicon substrate 6, which is typically slightly p-doped. A layer of semiconductor material 7 made of a binary alloy of a group III element nitride (in this instance GaN) is formed above the substrate 6. What is termed a barrier layer of semiconductor material, made of a ternary alloy of a group III element nitride (in this instance AlGaN), 9 is formed above the layer 7. An electron gas layer 8 is intrinsically formed at the interface between the layer 7 and the layer 9.

The transistor 2 includes a first conduction electrode 11 and a second conduction electrode 12, between which a current must selectively be established or interrupted.

The transistor 2 further includes a first control gate 21 and a second control gate 22. The control gates 21 and 22 are arranged between the conduction electrodes 11 and 12 so that each of the gates 21 and 22 is able to interrupt the current between the conduction electrodes 11 and 12. The control gates 21 and 22 thus extend over the electron gas layer 8 from one end to the other in a transverse direction, i.e. a direction that is perpendicular to the direction of conduction between the conduction electrodes 11 and 12.

The transistor 2 also includes a first reference electrode 31 and a second reference electrode 32. The reference electrodes 31 and 32 are electrically connected to the electron gas layer 8, in proximity to the respective control electrodes 21 and 22. The reference electrodes 31 and 32 are electrically connected to the electron gas layer via respective electrical connections 311 and 321. The reference electrodes 31 and 32 are here arranged between the control electrodes 21 and 22. In particular, the reference electrodes 31 and 32 are arranged in proximity to the gates 21 and 22, respectively.

The electrodes 11, 12, 31 and 32 and the gates 21 and 22 are here formed on top of the layer 9.

The layer 8 includes a channel zone 81, vertically in line with the gate 21. The channel zone 81 is selectively made conductive or nonconductive according to the voltage applied to the gate 21. The layer 8 includes a channel zone 82, vertically in line with the gate 22. The channel zone 82 is selectively made conductive or nonconductive according to the voltage applied to the gate 22. Depending on the design of the transistor 2, the zone 81 turns the left-hand portion of this transistor 2 off or on for a zero difference in potential between the reference electrode 31 and the gate 21. The transistor 2 is here a normally on transistor. Depending on the design of the transistor 2, the zone 82 turns the right-hand portion of this transistor 2 off or on for a zero difference in potential between the reference electrode 32 and the gate 22. The transistor 2 is here a normally off transistor.

The layer 8 also includes a zone 83, running between the electrode 11 and the zone 81. The zone 83 forms an electrical connection between the electrode 11 and the channel zone 81. The electrode 11 is electrically connected in a manner known per se to the zone 83, for example by locally doping the layer 9 below the electrode 11. The layer 8 also includes a zone 84, running between the electrode 12 and the zone 82. The zone 84 forms an electrical connection between the electrode 12 and the channel zone 82. The electrode 12 is electrically connected in a manner known per se to the zone 84, for example by locally doping the layer 9 below the electrode 12. The distance between the zones 83 and 84 is advantageously at least equal to 3 µm, preferably at least equal to 6 µm or, lastly, preferably at least equal to 10 µm with a view to guaranteeing a high breakdown voltage for the transistor 2. The layer 8 also includes a central zone 85, located between the zones 81 and 82. The conduction zone 85 is separated from the conduction zones 83 and 84 by the channel zones 81 and 82, respectively. The electrical connection 311 is connected to the conduction zone 85 in proximity to the channel zone 81. The electrical connection 311 thus allows the potential of the conduction zone 85 to be applied to the reference electrode 31 as close as possible to the channel zone 81. The electrical connection 311 is here formed from an extension or lateral protrusion of the electron gas layer 8 (in particular of the zone 85) to vertically in line with the reference electrode 31. The electrical connection 321 is connected to the conduction zone 85 in proximity to the channel zone 81. The electrical connection 321 thus allows the potential of the conduction zone 85 to be applied to the reference electrode 32 as close as possible to the channel zone 82. The electrical connection 321 is here formed from a lateral extension or protrusion of the electron gas layer 8 (in particular of the zone 85) to vertically in line with the reference electrode 32.

To make the transistor 2 more compact, the zone 85 is advantageously arranged between a group of contacts for the gate 21 and for the electrode 11 and a group of contacts for the gate 22 and for the electrode 12. These groups of contacts are thus arranged on either side of the zone 85 in the transverse direction. Advantageously, the zone 85 is advantageously arranged between a group of contacts for the gate 21, for the electrode 31 and for the electrode 11 and a group of contacts for the gate 22, for the electrode 31 and for the electrode 12.

The layer 9 includes a zone 41, vertically in line with the electrode 31. The zone 41 connects the electrode 31 to the electrical connection 311, for example by the layer 9 being locally doped vertically in line with the electrode 31. The distance between the connection 311 and the zone 81 (i.e. the distance between the closest points of the connection 311 and of the zone 81) is advantageously at most equal to 1.5 times the length of the gate 21. The distance between the connection 311 and the zone 81 is advantageously at most equal to 0.15 times the width of the zone 85. The distance between the connection 311 and the zone 81 is advantageously preferably at most equal to 2 µm. The layer 9 also includes a zone 42, vertically in line with the electrode 32. The zone 42 connects the electrode 32 to the electrical connection 321, for example by the layer 9 being locally doped vertically in line with the electrode 32. The distance between the connection 321 and the zone 82 (i.e. the distance between the closest points of the connection 321 and of the zone 82) is advantageously at most equal to 1.5 times the length of the gate 22. The distance between the connection 321 and the zone 82 is advantageously at most equal to 0.15 times the width of the zone 85. The distance between the connection 321 and the zone 82 is advantageously preferably at most equal to 2 µm. These parameters promote the retrieval of a reference potential in proximity to the channel whose conduction state it is desired to control.

A control circuit 51 is configured to apply a bias voltage to the gate 21 which is defined relative to the voltage of the reference electrode 31. Controlling relative to the potential of a reference electrode in this way makes it possible to avoid having to reference the potential of a gate relative to the potential of its conduction electrode, which is advantageous for a bidirectional transistor for which a driver circuit for driving the gates is easy to size because the difference in potential between the reference electrodes 31 and 32 is smaller. Similarly, a control circuit 52 is configured to apply a bias voltage to the gate 22 which is defined relative to the voltage of the reference electrode 32. The transistor 2 is here insulated from other electronic components by trench isolations (not illustrated).

Such a transistor 2 behaves as a bidirectional switch that can be driven, for each direction, by a voltage applied between a gate and a potential reference, but the footprint and the resistance in the on state of which are comparable to those of a unidirectional transistor. Specifically, when the transistor 2 is in the off state, the breakdown voltage is here ensured by the distance all the way between the gates 21 and 22 (corresponding to the zone 85). Furthermore, this breakdown voltage is obtained without negatively affecting the on-state resistance of the transistor 2, since the conduction distance through the electron gas 8 is substantially equal to the distance providing the breakdown voltage of the transistor 2 in the off state, contrary to the teaching of the document EP2736078.

The following notation will be used: V11: voltage on the electrode 11; V12: voltage on the electrode 12; V51: the potential difference applied between the gate 21 and the reference electrode 31; V52: the potential difference applied between the gate 21 and the reference electrode 32; V1211 the potential difference between the conduction electrodes 11 and 12.

In the present example, the transistor 2 is a normally off transistor, with a positive threshold voltage Vth.

Figure 3:
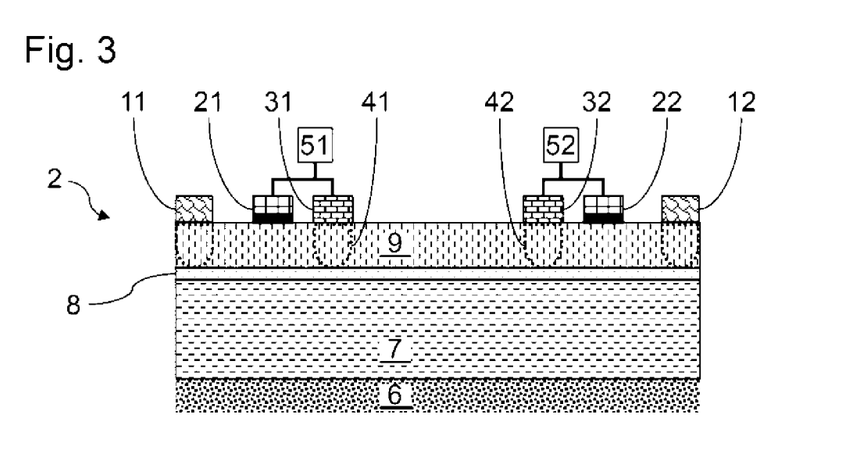
FIG. 3 is a cross-sectional view of the transistor of FIG. 1 in the on state.
Figure 4:
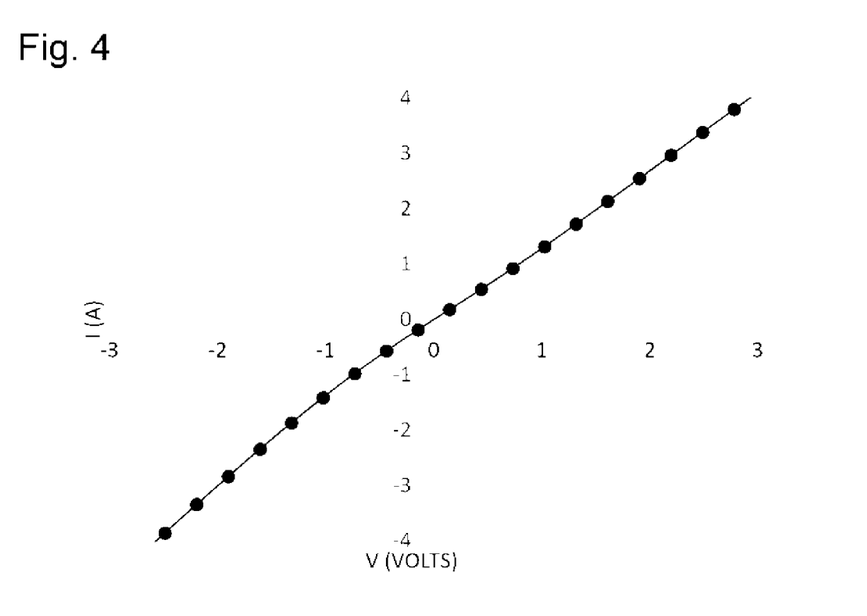
FIG. 4 is a graph showing the voltage/current between the conduction electrodes of the transistor in the on state.

When the voltages V51 and V52 equal one another and are higher than Vth, the current flows through the layer 8 between the electrodes 11 and 12, from the electrode 11 to the electrode 12. The transistor is then in a first operating mode: symmetric on state. This behaviour is illustrated by FIG. 3 and the voltage/current graph of FIG. 4. The electron gas layer 8 runs here continuously until making electrical contact with the conduction electrodes 11 and 12. The transistor 2 thus exhibits similar behaviour with the current in the opposite direction, when V11 is higher than V12 or when V12 is higher than V11. In this operating mode, the transistor 2 is used in current-modulation mode via the amplitude of the potential differences V51 and V52. The measurement was taken here with a voltage V1211 from −3 V to 3 V and potential differences V51 and V52 of 6 V (with Vth=2 V).

Figure 5:
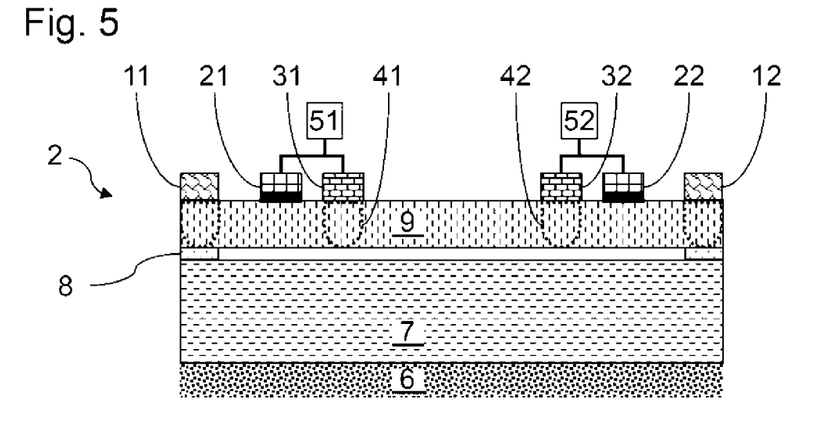
FIG. 5 is a cross-sectional view of an HEMT transistor according to one embodiment of the invention, in the off state.
Figure 6:
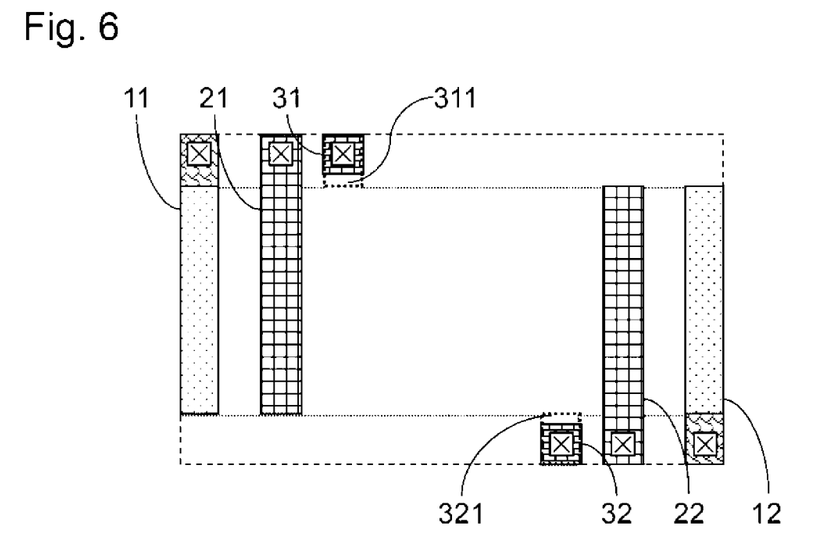
FIG. 6 is a top view of the transistor of FIG. 5.
Figure 7:
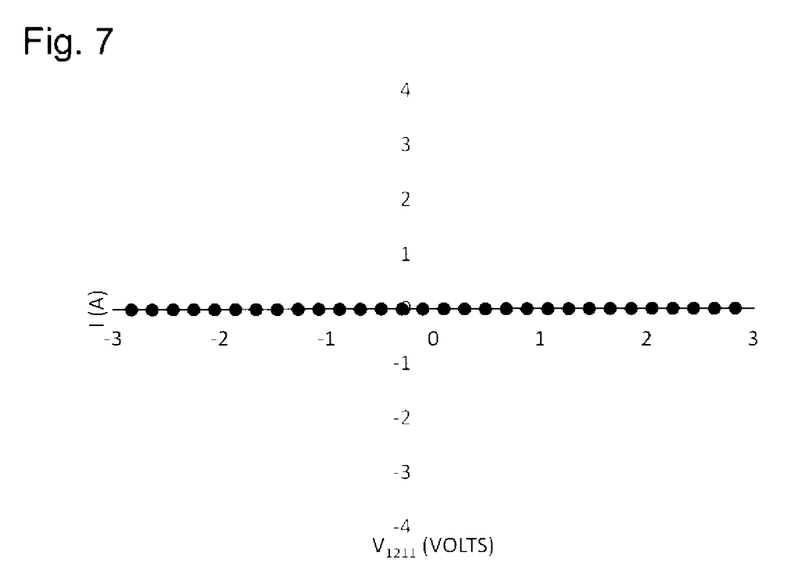
FIG. 7 is a graph showing the voltage/current between the conduction electrodes of the transistor in the off state.

However, when V51 and V52 are lower than Vth, whatever the voltages V11 and V12, the transistor 2 is off in both directions. This is a second operating mode: the symmetric off state. This behaviour is illustrated by FIGS. 5 and 6 and the voltage/current graph of FIG. 7. The electron gas layer 8 is here suppressed between the contacts with the electrodes 11 and 12. In this example, the potential differences V51 and V52 are equal to −6 V.

Figure 8:
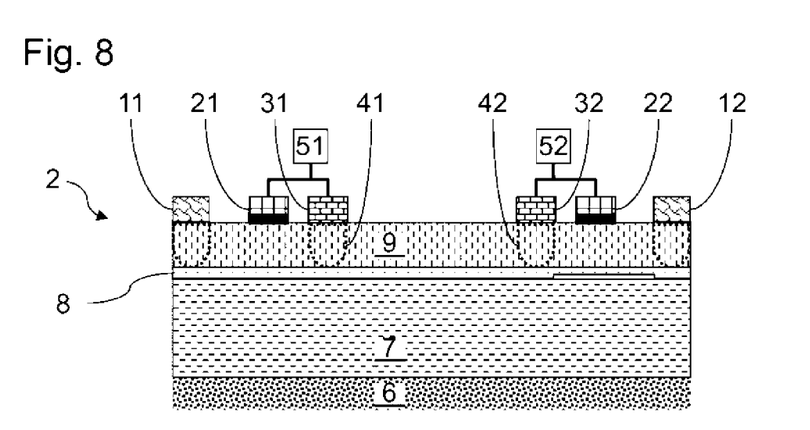
FIG. 8 is a cross-sectional view of an HEMT transistor according to one embodiment of the invention, in the asymmetric on state.
Figure 9:
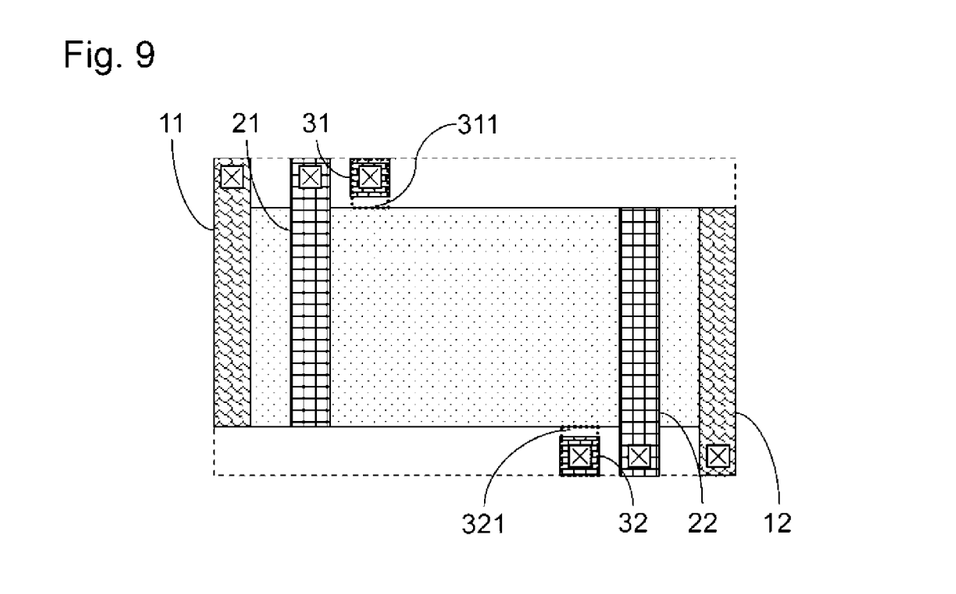
FIG. 9 is a top view of the transistor of FIG. 8.
Figure 10:
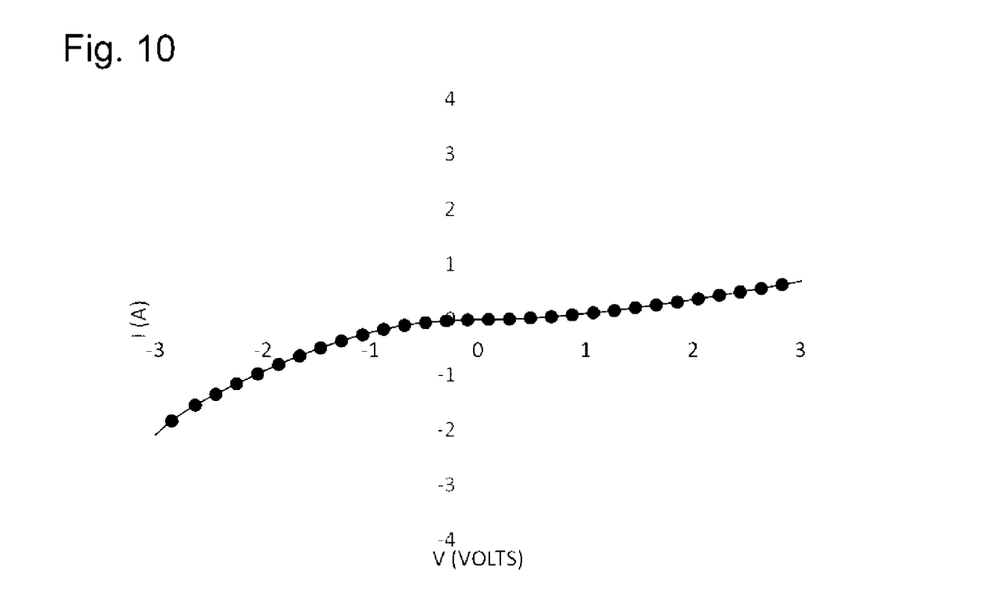
FIG. 10 is a graph showing the voltage/current between the conduction electrodes of the transistor in an asymmetric on state.

When V51>V52>Vth (and reciprocally, if V52>V51>Vth), the transistor 2 has a current that is regulated by the gate voltages, in particular V52, which is the smallest: the gate 51 allows more electrons into the electron gas layer 802 than the gate 52. This is a third operating mode: the asymmetric on state. The transistor 2 behaves as a diode for conduction from the electrode 12 to the electrode 11. The current from the electrode 11 to the electrode 12 is relatively small. This behaviour is illustrated by FIGS. 8 and 9 and the voltage/current graph of FIG. 10. In this example, Vth=2 V and the potential differences V51 and V52 are 6 V and 3 V, respectively.

Figure 11:
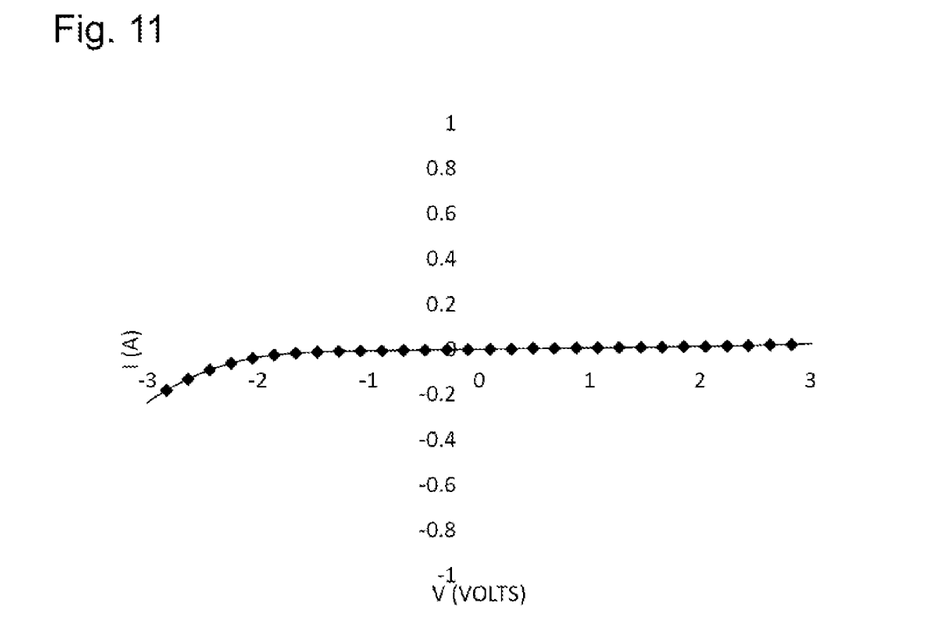
FIG. 11 is a graph showing the voltage/current between the conduction electrodes of the transistor in an asymmetric off state.

When V51>Vth>V52, asymmetric operation in the off state is obtained: the transistor 2 again behaves as a diode for conduction from the electrode 12 to the electrode 11. Current from the electrode 11 to the electrode 12 is blocked, as illustrated in FIG. 11. In this example, Vth=2 V and the potential differences V51 and V52 are 6 V and 1 V, respectively.

FIGS. 12 to 16 are sectional views of an HEMT transistor 2 at various steps in an exemplary fabrication process. FIGS. 12 to 16 illustrate the right-hand portion of the transistor 2 at the conduction electrode 12, the gate 22 and the reference electrode 32. The left-hand portion of the transistor 2 exhibits symmetry with respect to this right-hand portion, with which it is connected via an intermediate portion including the conduction zone 85.

Figure 12:
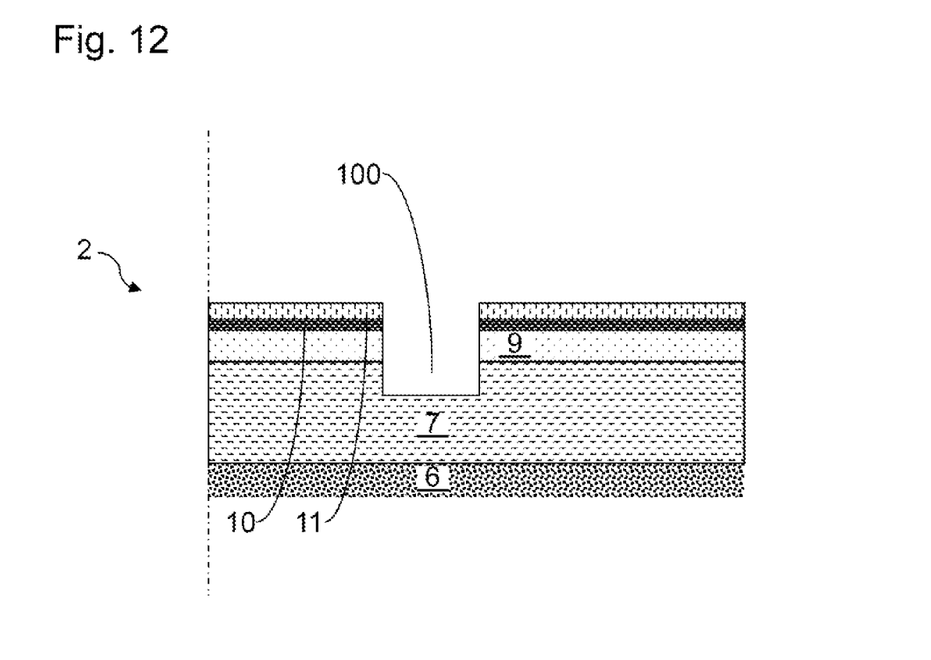
FIG. 12 illustrates one step of a process for fabricating a transistor according to one embodiment of the invention.

For the transistor 2 in the process of being formed as illustrated in FIG. 12, a silicon substrate 6, which is typically slightly p-doped, with a thickness of 1 mm is provided here, on which a semiconductor layer 7 made of a binary alloy of a group III element nitride (in this instance GaN) is formed. A semiconductor barrier layer 9, made of a ternary alloy of a group III element nitride (for example AlGaN, for example with an aluminium content ranging from 20 to 25%, for a layer 7 made of GaN), with a thickness of 24 nm for example, is formed above the layer 7. An electron gas layer (not shown here) is intrinsically formed at the interface between the layer 7 and the layer 9. The electron gas layer may be delimited according to the configuration illustrated as a top view in FIG. 12. A passivation layer 10 is formed over the layer 9. The layer 10 may for example be formed in situ, straight after the deposition of the layer 9. The layer 10 may for example be made of $Si_3N_4$ and have a thickness of 10 nm. The layer 10 is covered with an insulating layer 11, formed for example of $Si_3N_4$. A groove 100 is in particular formed at the site of the gate to be formed, by anisotropically etching the layers 11, 10 and 9. The groove 100 extends here partly into the layer 7. For example, the width of the groove 100 is between 0.25 and 0.5 μm, and the depth thereof is between 225 and 325 nm. The groove 100 runs through the electron gas layer from one end to the other, separating it into two disjunct areas.

Figure 13:
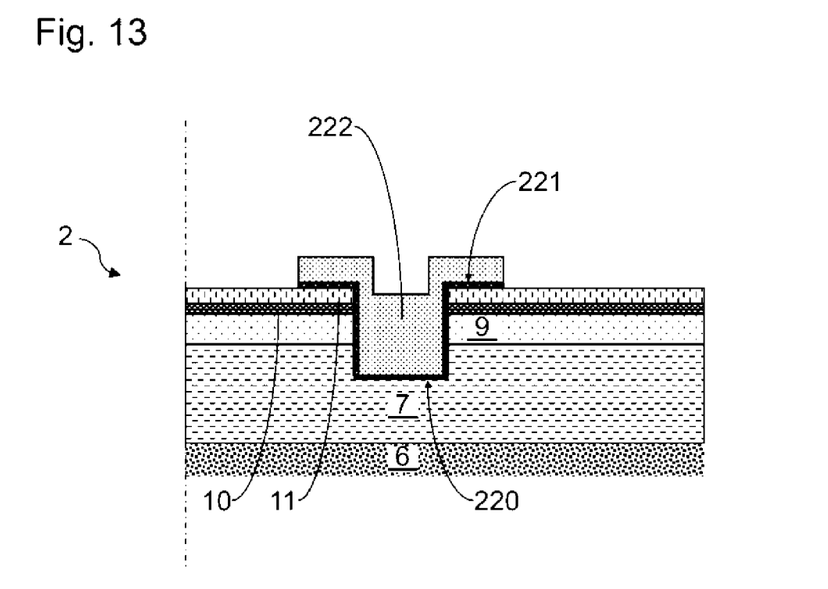
FIG. 13 illustrates another step of a process for fabricating a transistor according to one embodiment of the invention.

Next, as illustrated in FIG. 13, the contact for the gate 22 is formed by successively depositing the following layers. The layer 220, made of a material such as $Al_2O_3/SiO_2$, is first deposited, for example using a wafer-scale atomic layer deposition (ALD) process, and then potentially subjected to a post-deposition annealing operation. Next, the layer 221, including for example a material such as TiN, is deposited, for example using a wafer-scale physical vapour deposition (PVD) process. Lastly, the layer 222, including a material such as W or AlCu, is deposited, for example using a wafer-scale chemical vapour deposition (CVD) process. Next, after etching, only the gate stack, typically exhibiting a zone protruding for example by 25 μm at least on either side of the groove 100, shown in FIG. 12, is retained from the assembly of layers 220, 221 and 222. The insulating layer 11 is thus accessible over the rest of the component.

Figure 14:
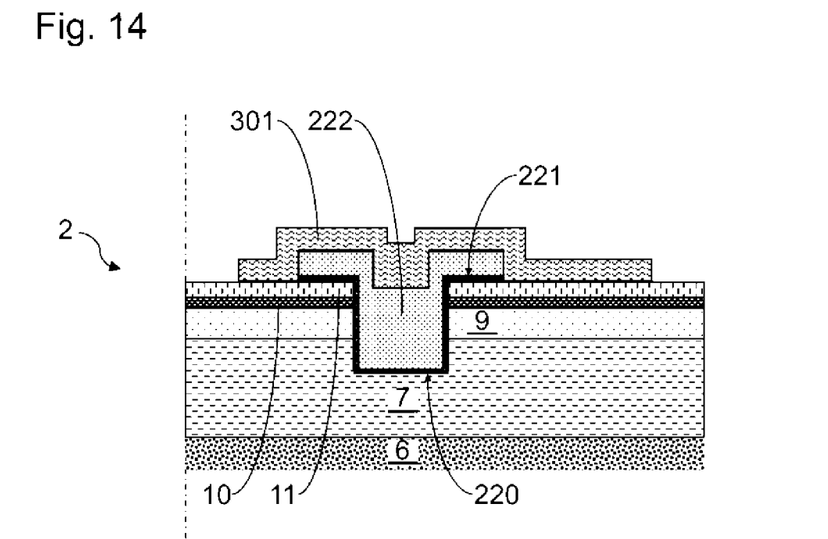
FIG. 14 illustrates another step of a process for fabricating a transistor according to one embodiment of the invention.

Next, as illustrated in FIG. 14, the layer 301 is formed by means of a wafer-scale deposition of a material, typically $SiO_2$, over a thickness ranging for example from 100 to 200 nm. Next, on either side of the stack of layers 220, 221 and 222, the layer 301 is etched so as to provide access to the insulating layer 11 over a length for example ranging from 1 to 1.5 μm.

Figure 15:
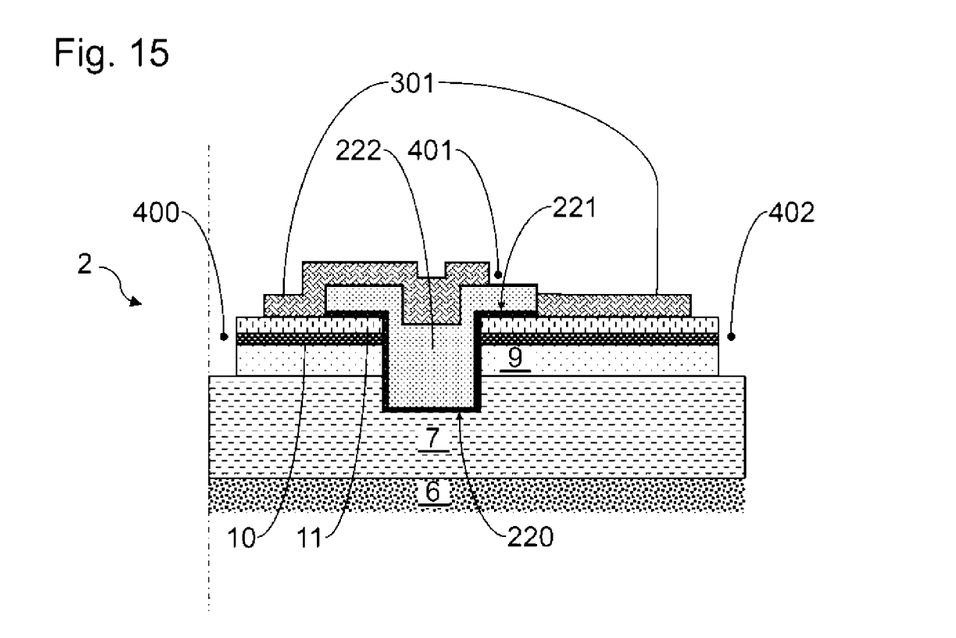
FIG. 15 illustrates another step of a process for fabricating a transistor according to one embodiment of the invention.

FIG. 15 illustrates the opening, by means of a lithography process, of an access 400 for the reference contact, of an access 401 for the gate contact and of an access 402 for the contact for the conduction electrode.

Figure 16:
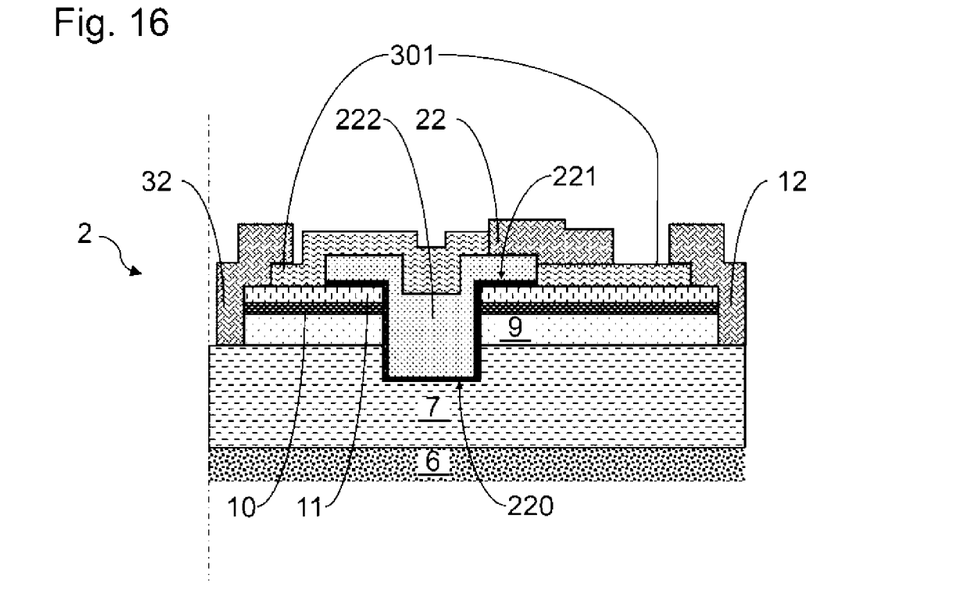
FIG. 16 illustrates another step of a process for fabricating a transistor according to one embodiment of the invention.

FIG. 16 illustrates the deposition of the metal for the contact for the reference electrode 32, of the metal for the gate contact 22 and of the metal for the contact for the conduction electrode 12. These deposits will advantageously be made of TiAlCu alloy, deposited in a wafer-scale process, before being subjected to a lithography etching process so as to form contacts that are independent of one another. It should be noted that the reference contact 32, located towards the median portion of the component, and the contact for the conduction electrode 12, located at the end of the component, rest on the layer 7, whereas the gate contact 22 rests on the layer 222.

The above examples describe reference electrodes that are electrically connected to the zone 85 of the electron gas layer via a lateral extension of this electron gas layer. It is also possible to envisage forming the electrical connection for the reference electrodes by forming a metal deposit running from the zone 85 of the electron gas layer to a remote lateral zone, where a respective reference electrode is connected.

The invention claimed is:

1. A device including a bidirectional heterojunction field-effect transistor, wherein the bidirectional transistor comprises:
    first and second conduction electrodes, first and second gates that are arranged between the first and second conduction electrodes, and first and second reference electrodes that are arranged between the first and second gates;
    a superposition of a first semiconductor layer and of a second semiconductive layer so as to form an electron gas layer, the electron gas layer comprising:
    a first channel zone that is arranged vertically in line with the first gate;
    a second channel zone that is arranged vertically in line with the second gate;
    a first conduction zone running between the first conduction electrode and the first channel zone;
    a second conduction zone running between the second conduction electrode and the second channel zone;
    a third conduction zone that is separated from the first and second conduction zones by the first and second channel zones, respectively;
    a first electrical connection that is connected to the third conduction zone in proximity to the first channel zone and connected to the first reference electrode;
    a second electrical connection that is connected to the third conduction zone in proximity to the second channel zone and connected to the second reference electrode;
    the device also comprising a first control circuit that is connected to the first reference electrode, the first control circuit being programmed to generate a control voltage for the transistor from a voltage of the first reference electrode and programmed to apply said control voltage to the first gate;
    the device also comprising a second control circuit that is connected to the second reference electrode, the second control circuit being programmed to generate a control voltage for the transistor from a voltage of the second reference electrode and programmed to apply said control voltage to the second gate;
    wherein said first and second gates extend over the electron gas layer from one end to the other in a first direction that is perpendicular to a direction of conduction between the first and second conduction electrodes, the transistor including respective contacts for the first gate, for the second gate, for the first conduction electrode and for the second conduction electrode, the third conduction zone being arranged between the contacts of the first gate and of the first conduction electrode on one side and the contacts of the second gate and of the second conduction electrode on the other side;
    wherein said first and second connections are electron gas strips that protrude with respect to the third conduction zone in said first direction.

2. The device according to claim 1, wherein a distance between the first and second conduction zones is at least equal to 3 μm.

3. The device according to claim 2, wherein the distance between the first and second conduction zones is at least equal to 6 μm.

4. The device according to claim 1, wherein a distance between said first connection and said first channel zone is at most equal to 1.5*Lg, where Lg is a gate length.

5. The device according to claim 1, wherein a distance between said first connection and said first channel zone is at most equal to 0.15*D, where D is the distance between the first and second channel zones.

6. The device according to claim 1, wherein a distance between said first connection and said first channel zone is at most equal to 2 μm.

7. The device according to claim 1, wherein a distance between said first and second conduction zones is at least equal to 10 μm.

8. The device according to claim 1, wherein the first and second control circuits are configured to apply, simultaneously, control voltages to the first and second gates, according to combinations selected from the group consisting of:
    a control voltage to the first gate that is higher than a threshold voltage of the first gate and a control voltage to the second gate that is higher than a threshold voltage of the second gate;
    a control voltage to the first gate that is lower than a threshold voltage of the first gate and a control voltage to the second gate that is higher than a threshold voltage of the second gate;
    a control voltage to the first gate that is lower than a threshold voltage of the first gate and a control voltage to the second gate that is lower than a threshold voltage of the second gate.

9. The device according to claim 8, wherein said first and second control circuits are configured to apply, simultaneously, control voltages to the first and second gates with a control voltage to the first gate that is higher than the threshold voltage of the first gate and a control voltage to the second gate that is higher than the threshold voltage of the second gate, a difference between the control voltage for the first gate and the threshold voltage of the first gate being greater than a difference between the control voltage for the second gate and the threshold voltage of the second gate.

10. The device according to claim 1, wherein the first and second reference electrodes include respective contacts with said first and second connections, the third conduction zone being arranged between the contacts of the first and second reference electrodes.

11. The device according to claim 1, wherein said first and second control circuits are configured to apply control voltages of different amplitudes to the first and second gates, respectively.

12. The device according to claim 1, wherein the first and second semiconductor layers are GaN alloys.

* * * * *